US006960919B2

United States Patent
Barmettler

(10) Patent No.: US 6,960,919 B2
(45) Date of Patent: Nov. 1, 2005

(54) MEASUREMENT CONNECTOR FOR TEST DEVICE

(75) Inventor: Mark G. Barmettler, Cedar Hill, TX (US)

(73) Assignee: AVO Multi-AMP Corporation, Dallas, TX (US)

( * ) Notice: Subject to any disclaimer, the term of this patent is extended or adjusted under 35 U.S.C. 154(b) by 7 days.

(21) Appl. No.: 10/740,699

(22) Filed: Dec. 19, 2003

(65) Prior Publication Data

US 2005/0134289 A1 Jun. 23, 2005

(51) Int. Cl.[7] .......................................... G01R 31/02
(52) U.S. Cl. ..................... 324/539; 324/538; 439/638
(58) Field of Search ................ 324/601, 628, 324/754, 761, 538, 539; 439/607, 638; 709/250; 714/715

(56) References Cited

U.S. PATENT DOCUMENTS

| | | | |
|---|---|---|---|
| 5,629,628 A * | 5/1997 | Hinds et al. | 324/628 |
| 5,714,885 A | 2/1998 | Lulham | 324/529 |
| 6,388,437 B1 * | 5/2002 | Wolski et al. | 324/158.1 |
| 6,611,147 B2 * | 8/2003 | White et al. | 324/539 |
| 6,847,213 B2 * | 1/2005 | Renken et al. | 324/628 |
| 2004/0113604 A1 | 6/2004 | Renken et al. | |

OTHER PUBLICATIONS

Fluke Networks, *Universal Permanent Link Adapters*, Jul. 2003, 2 pages.
International Search Report and Written Opinion of the International Searching Authority, PCT/US04/41979, Mar. 31, 2005, 5 pgs.

* cited by examiner

*Primary Examiner*—Walter Benson
(74) *Attorney, Agent, or Firm*—Conley Rose, P.C.; J. Robert Brown, Jr.

(57) ABSTRACT

A measurement connector for connecting a device to testing network cabling is provided. The device includes a device housing having a coupling portion and a test module retained by the device housing and having circuitry to promote testing of a channel of the network cabling. A biased connector extends from the device housing and communicates with the circuitry of the test module. An adapter housing is configured to couple with the coupling portion of the device housing. A mating portion promotes connection to the network cabling and is coupled to the adapter housing. A contact communicates with the mating portion and is coupled to the adapter housing such that the biased connector contacts the contact when the adapter housing is coupled to the device housing.

20 Claims, 2 Drawing Sheets

MEASUREMENT CONNECTOR FOR TEST DEVICE

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

This invention relate in general to the field of measurement devices and connectors and more specifically, but not by way of limitation, to a connector for connecting devices, such as a measurement device for testing network cabling, to network cabling via an adapter.

BACKGROUND OF THE INVENTION

Information system networks include cabling and adapters for communicating data signals. The cabling and adapters installed in an office or other structure must meet certain standards to verify that the network is working properly in the structure. To certify network cabling, a measurement or test device is connected at one point in the local area network of the structure and a second measurement device is connected at another point in the network. The first measurement device, for example, generates a signal that is transmitted through the network cabling that is received by the second measurement device, which analyzes the signal to evaluate the integrity of the cabling.

When the cabling does not meet certification standards, the contractor, such as a building construction company or network installer, is required to repair or place the network cabling to bring the network to standards for certification. The measurement devices are constructed to precise generate signals for transmission across the network and accurately measure aspects of the signal received across the network.

Connecting devices to local area networks is typically accomplished using a network adapter. The adapter may include a plug to connect into the wall jack or plate, which connects to cabling comprising the local area network. One example of a network topology is a four-channel copper wiring system where each channel includes a pair of shielded copper wires.

The network may include a number of channel adapters, or wall plates with a female receiving portion or jack, and link adapters, or male plugs presented from the network. The correct channel adapter or link adapter, depending upon the network topology at a particular location in the network, is required to connect a particular device to the network.

Network adapters that the device employs to connect the measurement device to the network, however, may introduce communication errors in otherwise accurate signal, which cannot be separated from the local areas network cabling. For example, a signal transmitted by the measurement device may be highly accurate, but can easily be degraded by the adapter. The measurement device receiving the signal will analyze the signal as being deficient for certification purposes, although no errors were the result of cabling or network infrastructure. In this instance, the network cabling would fail the certification and require repair or replacement, when in fact the adapter connecting the device to the wall jack of the network was actually the cause of the errors. For the reason, it is imperative that the adapters, particularly in a measurement test environment, not introduce errors or otherwise interfere with the signals to insure that only the network cabling is being tested. Unfortunately, measurement test devices routinely incorporate off-the-shelf adapters, which are inadequate for these purposes and cause inefficiencies, additional expense and frustration for those desiring to certify the local area network cabling.

SUMMARY OF THE INVENTION

In one embodiment, the present disclosure provides a measurement connector for connecting a device to testing network cabling. The device includes a device housing having a coupling portion and a test module, which in some aspects may be a circuit board, retained by the device housing and having circuitry to promote testing of a channel of the network cabling. A biased connector extends from the device housing and communicates with the circuitry of the circuit board. An adapter housing is configured to couple with the coupling portion of the device housing and a second circuit board is retained within the adapter housing. A mating portion promotes connection to the network cabling and is coupled to the adapter housing and communicates with the second circuit board. A contact communicates with the second circuit board and is coupled to the adapter housing such that the biased connector contacts the contact when the adapter housing is coupled to the device housing.

In another embodiment, a measurement connector system for connecting a device to a local area network is provided. The measurement connector system includes a device housing having a coupling portion. The device housing retains circuitry operable to measure signals from at least one channel of the local area network cabling. A first biased contact extends from the device housing and communicates with the circuitry of the device.

The measurement connector system further includes a second biased contact extending from the device housing and communicating with the circuitry of the device. An adapter housing is configured to couple with the coupling portion of the device housing. A mating portion is coupled to the adapter housing to promote connection to the local area network cabling. A first contact is operable to communicate with the at least one channel of the local area network cabling, via the mating portion. The first contact is coupled to the adapter housing such that the first biased contact contacts the first contact when the adapter housing is coupled to the device housing. A second contact is operable to communicate with the at least one channel of the local area network cabling, via the mating portion, the second contact is coupled to the adapter housing such that the second biased contact contacts the second contact when the adapter housing is coupled to the device housing.

In one embodiment, a connector assembly for connecting a device to a local area network adapter for connection to a local area network is provided. The connector system includes a device housing having a mating portion configured to couple to the local area network adapter. A module, which in some aspects of the present embodiment may be a circuit board, is retained by the device housing and has circuitry to receive communication from at least one channel of the local area network cabling.

A first biased contact is coupled to the circuit board circuitry. The first biased contact extends from the device housing such that the first biased contact electrically contact a portion of the local area network adapter and is operable to communicate with a first portion of the at least first channel of the local area network cabling when the local area network adapter is coupled to the device housing. A second biased contact is coupled to the circuit board circuitry and spaced a distance from the first biased contact such that the second biased contact electrically contact a second portion of the local area network adapter and is operable to communicate with a second portion of the at least first channel of the local area network cabling when the local area network adapter is coupled to the device housing.

In some aspects, the distance determined using an inductance component associated with the first biased contact and a capacitance component related to the distance between the first and second biased contacts to achieve a desired impedance related to an impedance of the at least first channel of the local area network cabling. In one aspect, the connector assembly is operable to test network cabling having a second channel. In this aspect, the connector system further includes a third and fourth biased contacts coupled to the circuit board circuitry that communicates with the second channel of the local area network cabling such that the third and fourth biased contacts are positioned relative to the first and second biased contacts to minimize the interaction of an electromagnetic field generated by the first and second biased contacts and an electromagnetic field generated by the third and fourth biased contacts.

These and other features and advantages will be more clearly understood from the following detailed description taken in conjunction with the accompanying drawings and claims.

BRIEF DESCRIPTION OF THE DRAWINGS

For a more complete understanding of the presentation and the advantages thereof, reference is now made to the following brief description, taken in connection with the accompanying drawings in detailed description, wherein like reference numerals represent like parts.

DETAILED DESCRIPTION OF THE PREFERRED EMBODIMENTS

It should be understood at the outset that although an exemplary implementation of one embodiment is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

Figure 1:
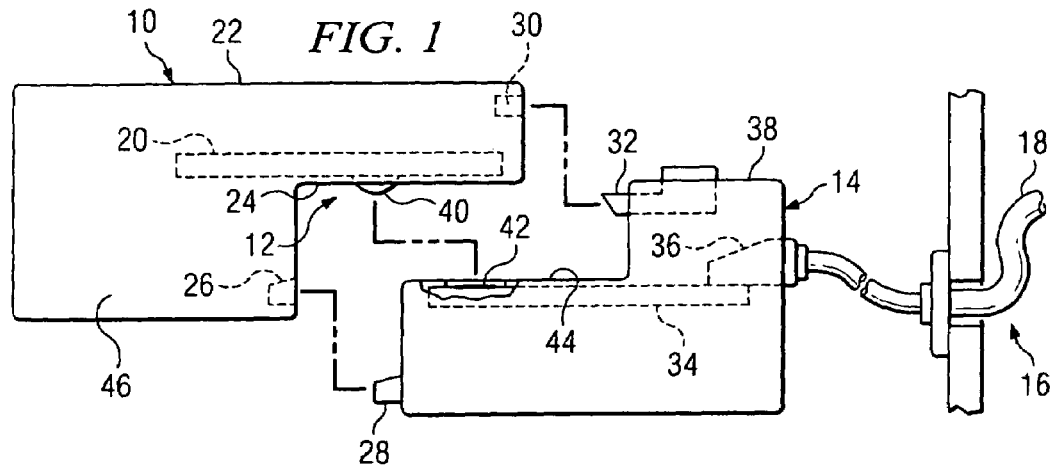
FIG. 1 is a side view of a measurement device employing one embodiment of a measurement connector to couple to an adapter for connection to a local area network.

FIG. 1 is a side-view illustrating a device 10 employing a connector assembly 12 for coupling to an adapter 14 connectable a network 16. The device 10 may be a measurement or test device, such as a local area network certification test device for certifying cabling 18 of the network 16. The device 10, in other embodiments, is a computer, peripheral, network appliance or other device usefully employing an adapter 14 for connection to the network 16. In the present embodiment, the device 10 is operable for testing and measuring network cabling and includes a module 20 operable for these purposes. The module 20, in one aspect of the present embodiment, is a circuit board retained within a housing 22 of the device 10.

The module 20 includes circuitry, processors, and programming for testing the cabling, such as by generating signals for transmission to the network 16. The module 20 is further operable for analyzing signals received from the network 16 to analyze the integrity of the network 16 cabling 18. The housing 22 is configured to couple to the adapter 14 about a lower first end 24 of the housing 22. To further secure the adapter 14 to the device 10, the housing 22 may include an opening 26, such a notch, configured to receive a post 28 extending from one side of the adapter 14.

In some aspects, the housing 22 may include a second opening 30 to receive a latch 32 coupled to an upper portion of the adapter 14. The latch 32 on the adapter 14 may be operable to engage, in a sliding manner, the second opening 30 of the housing 22. The mating configuration of the housing 22 with the adapter 14 promotes a solid coupling of the device 10 to the adapter 14.

The adapter 14 is provided with circuitry 34 coupled to a mating portion 36, which are both coupled to an adapter housing 38. The mating portion 36 is operable to promote connection to the cabling 18 of the network 16. In one embodiment the mating portion 36 is a channel adapter, or wall plate type female jack operable to receive a male plug, while in other embodiments, the mating portion 36 is a link adapter having a patch cord (not shown) extending from the adapter 14 provided with a male plug at the end of the patch cord. The circuitry 34 communicates with the mating portion 36 for transmitting signals between the network 16.

The connector assembly 12 includes a first biased contact 40 that is electrically coupled to the module 20. The first biased contact 40 extends from the device housing 22, substantially as illustrated. The first biased contact 40 resiliently extends from the housing 22 for electrical communication with a contact 42 coupled to the circuitry 34 of the adapter 14. In the present embodiment, the contact 42 is a portion of the circuitry 34, such as, but not limited to, a trace on a printed circuit board that form contact locations on the adapter 14. The first biased contact 40, in the present embodiment, is a spring-loaded push-pin.

The contact 42 is a substantial flat electrical contact or trace provided on a surface 44 of a portion of the adapter 14 by positioning the circuitry 34 exposed such that the contact 42 electrically couples with the first biased contact 40 when the adapter 14 is connected to the device 10. It will be appreciated that FIG. 1 is illustrative on one embodiment of a configuration the adapter 14 to the device 10 housing 22 to achieve this coupling, however other configurations, such as the location and disposition of the openings 26 and 30 and connection thereto the adapter 14, will readily suggest themselves to one of ordinary skilled in the art when provided with the present disclosure. For example, the adapter 14 and housing 22 of the device 10 may be configured such that the adapter 14 is received by a side 46 of the housing 22. A number of connections and configurations may be provided and are within the spirit and scope of the present disclosure.

Furthermore, the location of the first biased contact 40 extending from the housing 22, as well as the location and disposition of the contact 42 on the adapter 14, may be changed or modified, but operate substantially as described which are within the spirit and scope of the present disclosure.

Figure 2:
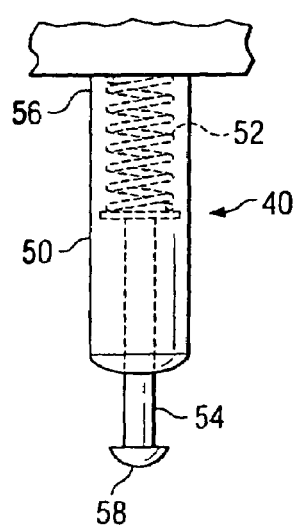
FIG. 2 is a side view of a spring-loaded push-pin of a connector assembly, according to one embodiment of the present disclosure.

FIG. 2 illustrates one aspect of the first biased contact 40 as a spring-loaded push-pin. In this embodiment, the first biased contact 40 includes a shaft 50 wherein a spring 52 or other biasing mechanism is provided. A pin 54 extends from one end of the shaft 50 while a portion of the pin 54 is biased by the spring 52 and resiliently extend from the end of the shaft 50. A lower portion 56 of the shaft 50 is connected to the module 20 for communicating signals from the network 16 to the module 20 for measurement and testing purposes.

The spring 52 forces an end 58 of the pin 54 into contact with, for example, the contact 42 ensuring a sufficient electrical coupling of the first biased contact 40 with the contact 42. In the event the pin 54 becomes bent or broken, the pin 54 is easily removed from the shaft 50 and replaced with another pin 54. A replacement pin 54 is simply reinserted into shaft 50 without disturbing the connection of the shaft 50 to the module 20. This configuration eliminates the need to return the device 10 to the manufacturer in the event of breakage of the pin 58, for example, since replacement of the pin 58 may be readily accomplished by a field service technician or the user of the device 10. Employing a biased contact, such as the first biased contact 40 is also useful in that this configuration breaks through oxidation that ordinarily occurs on such contacts and which reduces the electrical conductivity of such connections.

Figure 3:
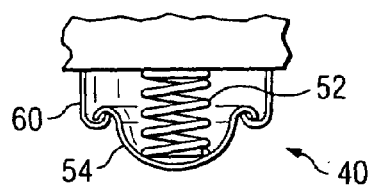
FIG. 3 is a side-view of another embodiment of a biased contact of the connector assembly.

FIG. 3 illustrates another embodiment of the first biased contact 40. In this embodiment, the first biased contact 40 includes a housing 60, which retains the pin 54. The pin 54 is configured as a substantially domed shaped contact retained by the housing 60. The spring 52 similarly has a biasing effect on the pin 54, causing the pin 54 to resiliently extend away from the housing 60.

The embodiments of the first biased contract 40 illustrated in FIGS. 2 and 3 are exemplary and a number of other biasing contacts or connectors may be employed are within the spirit and scope of the present disclosure. Furthermore, employing the contact 42 as the point of electrical contact for the first biased contact 40 substantially reduces the cost of the adapter 40, since this configuration eliminates the need for complex pins or couplings on the adapter 14 to achieve electrical communication with the device 10. In an environment where a number of adapters 14 are required for connection to the network, such as in measurement test device environments, reducing the costs associated with each adapter 14 results in a considerable savings where numerous adapters 14 are necessary.

Referring again to FIG. 1, the first biased contact 40 is shown having a low profile with regard to the extension of the pin 54 from the housing 22 which reduces the likelihood that the pin 54 will be damaged when the device 10 is being transport without the adapter 14 coupled thereto. A measurement device for cable certification is, by its nature, portable and subject to being transported and removed from bags and luggage and placed on hardened surfaces when not in use. As such, it is useful to employ a configuration that considers the location of the vulnerable components, such has positioning the first biased contact 40 in the recess of the lower first end 24 of the housing 22. Further, it is useful to employ components, such as the first biased contact 40, that are not hardened and easily damaged and are instead adapted to absorb shock or impact.

Figure 4:
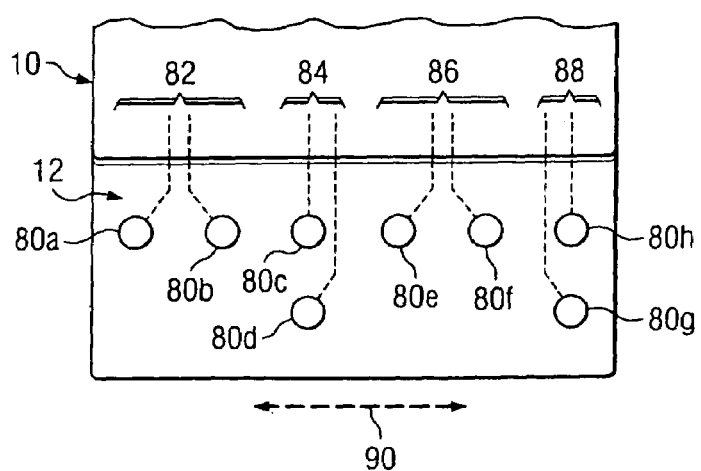
FIG. 4 is a partial bottom view of the measurement device illustrating one embodiment of the measurement connectors.

FIG. 4 is a partial bottom view of the device 10 illustrating one embodiment of the connector assembly 12 provided with a plurality of measurement connectors 80. The measurement connectors 80 are substantially similar in construction and configuration to the first biased contact 40 spring-loaded push-pins illustrated in FIG. 2 above. The measurement connectors 80 are designated alphanumerically 80a–h for clarity. The embodiment illustrated in FIG. 4 is operable for connection to a standard 4-channel network, such as the network 16, wherein each channel includes a pair of wires. For example, measurement connectors 80a and 80b correspond to a first channel 82 of the network 16 cabling 18, measurement 80c and 80d correspond to a second channel 84 of the cabling 18, measurement connectors 80e and 80f correspond to a third channel 86 of the cabling 18 and measurement connectors 80g and 80h correspond to a fourth channel 88 of the cabling 18 of the network 16.

The measurement connectors 80 are illustrated as electrically coupling to the module 20 (not shown) for communicating signals received from the cable 18 of the network 16 to the module 20 for measurement and other purposes. In one embodiment, the spring-loaded push-pins are electrically coupled to the module 20, which may be a circuit board, such that the pins 54 of each of the measurement connectors 80 extend from the housing 22 of the device 10 substantially as illustrated in FIG. 1.

In the present embodiment, the measurement connectors 80 are provided such that the measurement connectors 80 associated with each channel 82–88 are normal, or at a substantially 90-degree angle relative to the measurement connectors 80 of the adjacent channels 82–88. For example, measurement connectors 80a and 80b are positioned adjacent to one another on the module 20 in a substantially horizontal disposition relative to a horizontal line 90. Measurement connectors 80c and 80d are positioned in a vertical relationship with regard to one another but in a perpendicular relationship with regard to the horizontal line 90. This disposition of the measurement connectors 80 associated with each of the channels 82–88 is intended to increase the electrical quality and integrity of the connection of the device 10 to the adapter 14.

As previously discussed, it is desirable, in some aspects, that the device 10 connect to the cabling 18 of the network 16 without introducing errors in the channels 82–88 between the device, such as module 20, and the network 16. Two factors which may be responsible for introducing noise, interference, or other undesirable qualities include channel-to-channel cross-talk, and unwanted impedance variation. Cross-talk is an electric phenomenon related to energy that couples from one channel to channel. Impedance is an electric characteristic having an inductance component and a capacitance component that may introduce errors where the impedance of the components and circuitry of the device 10 and adapter 14 are different or do not match the impedance of the signal on the channel 82–88 of the cabling 18 being measured.

In one embodiment, the impedance of the particular channel 82–88 of the cabling 18 of the network 16 is determined, which in a 4-channel network is typically about 100 ohms. By achieving similar impedance with the device 10 connectors, such as measurement connectors 80a and 80b associated with the first channel 82, the impedance differential is controlled thereby eliminating any undesirable characteristics related to an imbalance or differential in the impedance of the channel 82–88 being analyzed.

In the present embodiment, controlled impedance differential is attained by determining an inductance component associated with the measurement connector 80, such as measurement connector 80a. For example, when measurement connector 80a is employed as spring-loaded push-pin, the spring-loaded push-pin has an inductance characteristic that is inherently related to its structure. Utilizing this inductance component, the capacitance aspect of impedance may be manipulated based on the distance between measurement connectors 80a and 80b. As the distance between measurement connectors 80a and 80b is increased, the capacitance characteristic of the channel decreases. Conversely, by reducing the distance between measurement connectors 80a and 80b the capacitance is increased. Thus using the inductance component associated with the measurement connector 80a and the capacitance component related to the distance between measurement connectors 80a and 80b, a desired impedance may be obtained for the measurement connectors 80a–b of the channel 82. In this manner, the impedance of the measurement connectors 80a–b may be made to substantially match the impedance of channel 82 from the cabling 18, thereby eliminating impedance errors related to the measurement connector 80 and achieving controlled impedance differential.

In one aspect, the desired impedance is related to the impedance of the first channel 82 of the cabling 18 of the network 16. In other aspects, the desired impedance is substantially similar to the expected impedance of the first channel 82, while in other aspects, the desired impedance is about 100 ohms where the impedance of the first channel 82 of the cabling 18 of the network 16 is also about 100 ohms in a 4-channel network. In one aspect, the distance between measurement connectors 80a and 80b is determined using an inductance component associated with an inductance characteristic of the actual spring-loaded push-pin utilized in this embodiment. In view of the controlled impedance differential teaching of the preset disclosure, a number of configurations of the measurement connectors 80 relative to the network 16 cabling 18 being test will suggest themselves to one skilled in the art and are within the spirit and scope of the present disclosure.

Measurement connectors 80c and 80d are similarly configured with regard to the second channel 84 and so on for measurement connectors 80e and 80f, measurement 80g and 80h with regard to the third and forth channels 86 and 88, respectively.

In addition to controlling the impedance differential, reducing cross-talk may also be beneficial for achieving good transmission characteristics and performance with and between the device 10 and adapter 14. In one embodiment, the measurement connectors 80a and 80b of the first channel 82 are positioned in a normal relationship with regard to the measurement connectors 80c and 80d of the second channel 84, substantially as discussed above. The normal disposition of the measurement connectors 80 of the first channel 82 and second channel 84 may be preferable, in one embodiment, to provide low adjacent channel cross-talk.

Figure 5:
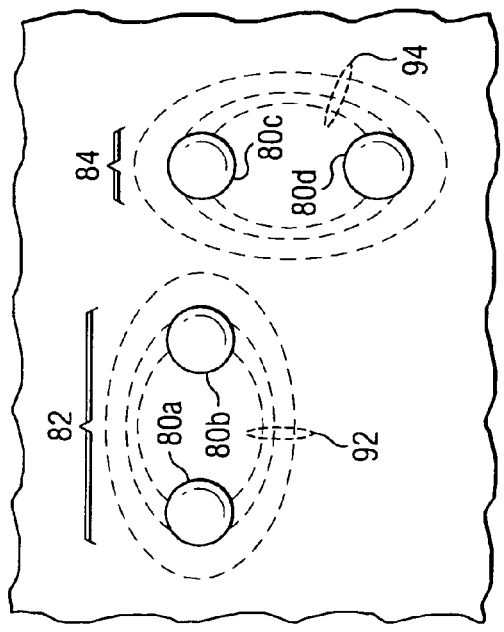
FIG. 5 illustrates electromagnetic fields of measurement connectors of adjacent channels.

Referring to FIG. 5, an example of an electromagnetic field 92 associated with the measurement connectors 80a and 80b of the first channel 82 are illustrated, as well as an electromagnetic field 94 associated with measurement connectors 80c and 80d of the second channel 84. The disposition of the measurement connectors 80 of the first channel 82 and second channel 84 is intended to reduce the interference of the electromagnetic fields 92 and 94 with one another. Thus, the normal orientation of the measurement connectors 80 of the first channel 82 with the second channel 84 provides low adjacent channel cross-talk since this configuration minimizes the overlap in the electromagnetic fields 92 and 94.

Although the normal relationship of the measurement connectors 80 of the first channel 82 with that of the second channel 84 are shown in a substantially perpendicular or 90 degree relationship to one another, other orientations or slight variations may be employed and are within the spirit and scope of the present invention.

Figure 6:
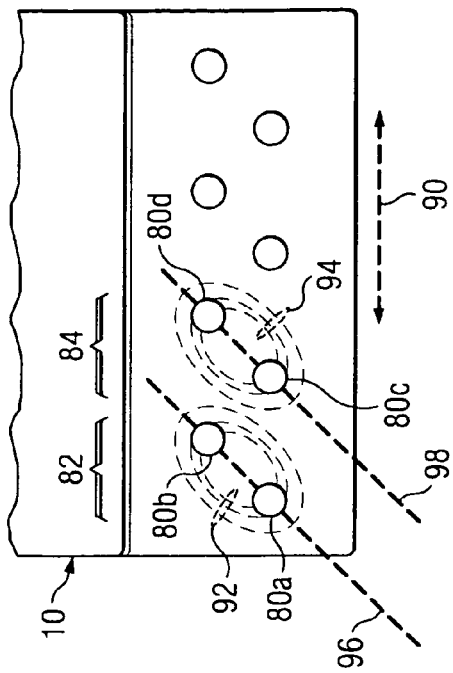
FIG. 6 is a partial bottom view of the measurement device illustrating another arrangement of the measurement connectors.

FIG. 6 is a partial bottom view of the device 10 illustrating the measurement connectors 80 provided in an alternative configuration according to another embodiment. In this embodiment, the measurement connectors 80a and 80b are positioned on the module 20 along a line 96 that is at about a 45-degree angle relative to the horizontal line 90. Similarly, the measurement connectors 80c and 80d of the second channel 84 are provided adjacent the measurement connectors 80a and 80b along a second line 98 that is at about a 45-degree angle relative to the horizontal line 90. In some aspects, this disposition of the measurement connectors 80 relative to the adjacent channels 82–88 may be desirable to provide low adjacent channel cross-talk between the electromagnetic fields 92 and 94 of the adjacent channels 82 and 84. In this aspect, the distance between the measurement connectors 80a and 80b may be determined substantially as described above with regard to achieving controlled impedance differential to prevent introduction of any unwanted impedance variations in the channels.

The remaining measurement connectors 80 are provided in a similar disposition on the module 20. The orientation of the measurement connectors 80 of the channels 82–88 provides low adjacent channel cross-talk since this configuration minimizes the overlap in the electromagnetic fields, including electromagnetic fields 92 and 94.

Figure 7:
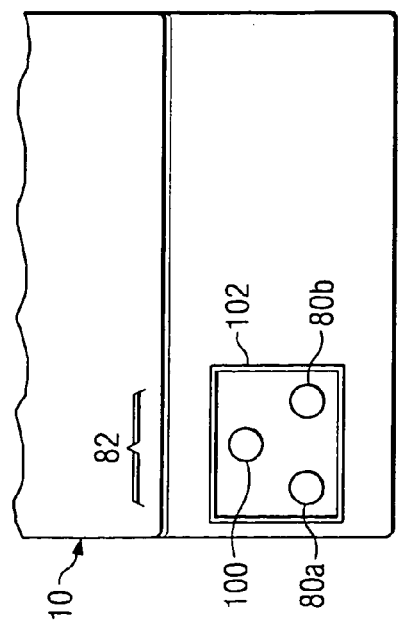
FIG. 7 is a partial bottom view of the measurement device illustrating another embodiment of the measurement connectors.

FIG. 7 is a partial bottom view of another embodiment of the device 10 illustrating another configuration of the measurement connectors wherein only measurement connectors 80a and 80b for the first channel 82 are shown for clarity. In this aspect, a ground terminal 100 is provided in a substantially triangular relationship with regard to the measurement 80a and 80b to further promote controlling the impedance differential through the connectors 80a and 80b. In addition, in this aspect, shielding 102 may be provided to further reduce the cross-talk between the first channel 82 and the adjacent channels (not shown in the current figure).

The shielding 102 may be a barrier constructed of a material to reduce or limit the extent, affect, or orientation of the electromagnetic field and may be constructed of material useful for these purposes. Shielding is widely known and employed for these purposes and may be provided in variety of configurations which will readily suggest themselves to one of ordinary skill in the art when provided with the present disclosure. Although the ground terminal 100 and shielding 102 is illustrated where the measurement connectors 80a and 80b are disposed in a substantially horizontal relationship, the ground terminal 100 and shielding 102 may also be employed where the measurement connectors 80 are otherwise configured, such as but not limited to, as illustrated in FIG. 6.

Figure 8:
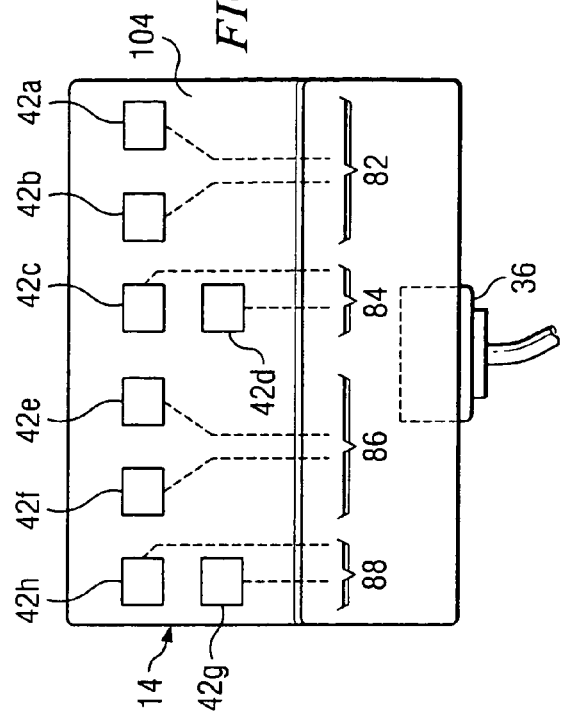
FIG. 8 is a partial bottom view of the adapter illustrating contacts for coupling to the measurement connectors.

FIG. 8 is a partial top view of one embodiment of the adapter 14 illustrating the contacts 42 for connection with the measurement connectors 80. The contacts 42 are labeled alphanumerically and correspond to the measurement connectors 80 illustrated in FIG. 4. The contacts 42 are electrically coupled to circuitry 34 (not shown) which may also be a circuit board or other electronics or coupling to the mating portion 36 of the adapter 14. In some aspects, the circuitry 34 is eliminated and the contacts 42 are directly coupled to the mating portion 36. The contacts 42 correspond to the channels 82–88 of the cabling 18 of the network 16. A number of configurations, arrangements and dispositions of the contacts 42 will readily suggest themselves to one of ordinary skill in the art.

In this embodiment, the contacts 42 are constructed of a material for communicating signals from the cabling 18 to the device 10 and are exposed on a surface 104 of the adapter 14. This configuration provides the contacts 42 in a rugged disposition on the adapter 14, which may be useful where the device 10 is a measurement device for certifying cable, as previously discussed. Additionally, the contacts 42 are a low cost component reducing the costs to produce a plurality of adapters 14 by utilizing spring-loaded push-pin type measurement connectors 80 in the device 10. The mating portion 36 may be provided as a link or channel adapter or other adapters or coupling for connection to the network 16 cabling 18.

While several embodiments have been provided in the present disclosure, it should be understood that the measurement connectors, measurement device and the adapter may be embodied in many other specific forms without departing from the spirit or scope of the present disclosure. The present examples are to be considered as illustrative and not restrictive, and the intention is not to be limited to the details given herein, but may be modified within the scope of the appended claims along with their full scope of equivalents. For example, the various elements or components may be combined or integrated in another system or certain features may be omitted, or not implemented.

Also, techniques, systems, subsystems and methods described and illustrated in the various embodiments as discreet or separate may be combined or integrated with other systems, modules, techniques, or methods without departing from the scope of the present disclosure. Other items shown as directly coupled or communicating with each other may be coupled through some interface or device, such that the items may no longer be considered directly coupled to each but may still be indirectly coupled and in communication with one another. Other examples of changes, substitutions, and alterations are ascertainable by on skilled in the art and could be made without departing from the spirit and scope disclosed herein.

What is claimed is:

1. A measurement connector system for connecting a device to a local area network, the measurement connector system comprising:
    a device housing having a coupling portion, the device housing retaining circuitry operable to measure signals from at least one channel of the local area network cabling;
    a first biased contact extending from the device housing and communicating with the circuitry of the device;
    a second biased contact extending from the device housing and communicating with the circuitry of the device;
    an adapter housing configured to couple with the coupling portion of the device housing;
    a mating portion coupled to the adapter housing to promote connection to the local area network cabling;
    a first contact operable to communicate with the at least one channel of the local area network cabling, via the mating portion, and coupled to the adapter housing such that the first biased contact contacts the first contact when the adapter housing is coupled to the device housing; and
    a second contact operable to communicate with the at least one channel of the local area network cabling, via the mating portion, and coupled to the adapter housing such that the second biased contact contacts the second contact when the adapter housing is coupled to the device housing.

2. A measurement connector system of claim 1, wherein the first and second biased contacts are further defined as a first and second push-pins.

3. The measurement connector system of claim 2, wherein the first and second push-pins are coupled to a circuit board retaining the circuitry such that the first push-pin is spaced a distance from the coupling of the second push-pin to the circuit board, the distance determined using an inductance component related to the structure of the first and second push-pins and a capacitance component related to the distance between the first and second push-pins to achieve a desired impedance related to an impedance of the at least first channel of the network cabling.

4. The measurement connector system of claim 2, wherein the first and second push-pins and device housing are configured to achieve a desired impedance related to an impedance of at least a first channel of the network cabling.

5. The measurement connector system of claim 2, wherein a portion of the capacitance component is based on a dielectric component related to a material provided between the first and second push-pins.

6. The measurement connector system of claim 3, further comprising:
    a third push-pin extending from the device housing and communicating with the circuitry of the device; and
    a fourth push-pin extending from the device housing and communicating with the circuitry of the device, third and fourth push-pins positioned relative to the first and second push-pins to reduce cross-talk between channels of the network.

7. The measurement connector system of claim 2, further comprising shielding provided to reduce cross-talk between channels of the local area network cabling being measured.

8. A connector assembly for connecting a device to a local area network adapter for connection to a local area network, the connector system comprising:
    a device housing having a mating portion configured to couple to the local area network adapter;
    a test module retained by the device housing and operable to receive communication from at least one channel of the local area network cabling;
    a first biased contact coupled to the test module, the first biased contact extending from the device housing such that the first biased contact is electrically coupleable to the local area network adapter and operable to communicate with a first portion the at least first channel of the local area network cabling when the local area network adapter is coupled to the device housing; and a second biased contact coupled to the test module and spaced a distance from the first biased contact, the second biased contact extending from the device housing such that the second biased contact is electrically coupleable to the local area network adapter and operable to communicate with a second portion the at least first channel of the local area network cabling when the local area network adapter is coupled to the device housing.

9. The connector assembly of claim 8, wherein the first and second biased contacts are further defined as pins.

10. The connector assembly of claim 8, wherein the network cabling includes a second channel and wherein the connector system further includes:

a third biased contact coupled to the test module; and a fourth biased contact coupled to the test module and communicating with at least a second channel of the local area network cabling such that the third and fourth biased contacts are positioned relative to the first and second biased contacts to minimize the interaction of an electromagnetic field generated by the first and second biased contacts and an electromagnetic field generated by the third and fourth biased contacts.

11. The connector assembly of claim 10, wherein the first and second biased contacts are positioned on the test module along a line that is at about a 45 degree angle relative to a horizontal line and wherein the third and fourth biased contacts are positioned on the test module adjacent the first and second biased contacts along a line that is at about a 45 degree angle relative to the horizontal line.

12. The connector assembly of claim 10, wherein the first and second biased contacts are positioned adjacent to one another on the test module along a line that parallel to a horizontal line and wherein the third and fourth biased contacts are positioned on the test module adjacent the first and second biased contacts and along a line that is at about a 90 degree angle relative to the horizontal line.

13. The connector assembly of claim 12, further comprising a fifth and sixth biased contacts coupled to the test module to communicate with the circuitry associated with a portion of a third channel of the network cabling, the fifth and sixth contacts positioned on the test module adjacent the third and fourth biased contacts and along a line that is parallel to the horizontal line.

14. The connector assembly of claim 8, wherein the desired impedance is substantially similar to an expected impedance of the at least first channel of the network cabling.

15. The connector assembly of claim 8, wherein the desired impedance is based on the impedance of the at least first channel of the network cabling.

16. The connector assembly of claim 8, wherein the desired impedance is about 100 ohms wherein the impedance of the at least first channel of the network cabling is about 100 ohms.

17. The connector assembly of claim 8, wherein the first and second biased contacts are further defined as spring-loaded push-pins.

18. The connector assembly of claim 8, wherein the distance between the first and second biased contacts determined using an inductance component related to the structure of the first and second biased contacts and a capacitance component related to the distance between the first and second biased contacts to achieve a desired impedance related to an impedance of the at least first channel of the local area network cabling.

19. A method of managing field interaction through orientation, comprising:

providing a device for communicating with a channel of a network;

providing a first biased contact coupled to the device for communicating with the first channel;

providing a second biased contact for communicating with the first channel;

determining an impedance component of the channel of the network;

determining an inductance component of the channel of the network;

positioning the second bias contact coupled to the device a distance from the first biased contact, the distance between the first and second biased contacts determined using the inductance component based on a structure of the first and second biased contacts and a capacitance component related to the distance between the first and second biased contacts to achieve a desired impedance related to the impedance of the first channel of the network.

20. The method of claim 19, further comprising:

providing a second contact coupled to the device;

providing a third contact coupled to the device;

locating the third and fourth biased contacts positioned relative to the first and second contacts to minimize the interaction of an electromagnetic field generated by the first and second contacts and an electromagnetic field generated by the third and fourth contacts.

* * * * *